United States Patent
Brinkhof et al.

(10) Patent No.: US 7,113,257 B2
(45) Date of Patent: Sep. 26, 2006

(54) ASSEMBLY COMPRISING A SENSOR FOR DETERMINING AT LEAST ONE OF TILT AND HEIGHT OF A SUBSTRATE, A METHOD THEREFOR AND A LITHOGRAPHIC PROJECTION APPARATUS

(75) Inventors: Ralph Brinkhof, Eindhoven (NL); Marcus Emile Joannes Boonman, Veldhoven (NL); Martin Jules Marie-Emile De Nivelle, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 50 days.

(21) Appl. No.: 10/797,570

(22) Filed: Mar. 11, 2004

(65) Prior Publication Data

US 2004/0257545 A1 Dec. 23, 2004

(30) Foreign Application Priority Data

Mar. 11, 2003 (EP) .................................. 03075704

(51) Int. Cl.
G03B 27/42 (2006.01)
G03B 27/52 (2006.01)
G01N 21/86 (2006.01)
G01R 31/26 (2006.01)

(52) U.S. Cl. ............................ 355/53; 355/55; 355/63; 250/548

(58) Field of Classification Search ................. 355/53, 355/55, 62, 63, 77; 250/548; 356/399, 400, 356/401; 438/14
See application file for complete search history.

(56) References Cited

U.S. PATENT DOCUMENTS

| 5,191,200 A | 3/1993 | van der Werf et al. |
| 5,229,872 A | 7/1993 | Mumola |
| 5,296,891 A | 3/1994 | Vogt et al. |
| 5,412,214 A | 5/1995 | Suzuki et al. |
| 5,523,193 A | 6/1996 | Nelson |
| 5,969,441 A | 10/1999 | Loopstra et al. |

(Continued)

FOREIGN PATENT DOCUMENTS

EP 1 037 117 A2 9/2000

(Continued)

OTHER PUBLICATIONS

"European Search Report dated Sep. 19, 2003".

*Primary Examiner*—Peter B. Kim
(74) *Attorney, Agent, or Firm*—Pillsbury Winthrop Shaw Pittman, LLP

(57) ABSTRACT

An assembly according to an embodiment of the invention includes a sensor for determining at least one of tilt and height of a surface of a substrate in a lithographic apparatus. The substrate is moveable along at least one path substantially parallel to the surface of the substrate with respect to the sensor. The lithographic apparatus has an exposure scanning direction and the assembly is arranged to move the substrate relative to the sensor along the at least one path and to provide measurement data about the at least one of tilt and height along the at least one path. The assembly includes a memory configured to store the measurement data for use during a later exposure of the substrate by the lithographic apparatus. The at least one path of the substrate is at least partly at an angle to the exposure scanning direction.

30 Claims, 6 Drawing Sheets

U.S. PATENT DOCUMENTS

| | | | |
|---|---|---|---|
| 6,046,792 A | 4/2000 | Van Der Werf et al. | |
| 6,245,585 B1 | 6/2001 | Fujimoto | |
| 6,798,529 B1 * | 9/2004 | Saka et al. | 356/630 |
| 6,818,365 B1 | 11/2004 | Barber | |
| 2003/0058423 A1 * | 3/2003 | Wakamoto | 355/53 |

FOREIGN PATENT DOCUMENTS

| | | |
|---|---|---|
| WO | WO 98/33096 | 7/1998 |
| WO | WO 98/38597 | 9/1998 |
| WO | WO 98/40791 | 9/1998 |

* cited by examiner

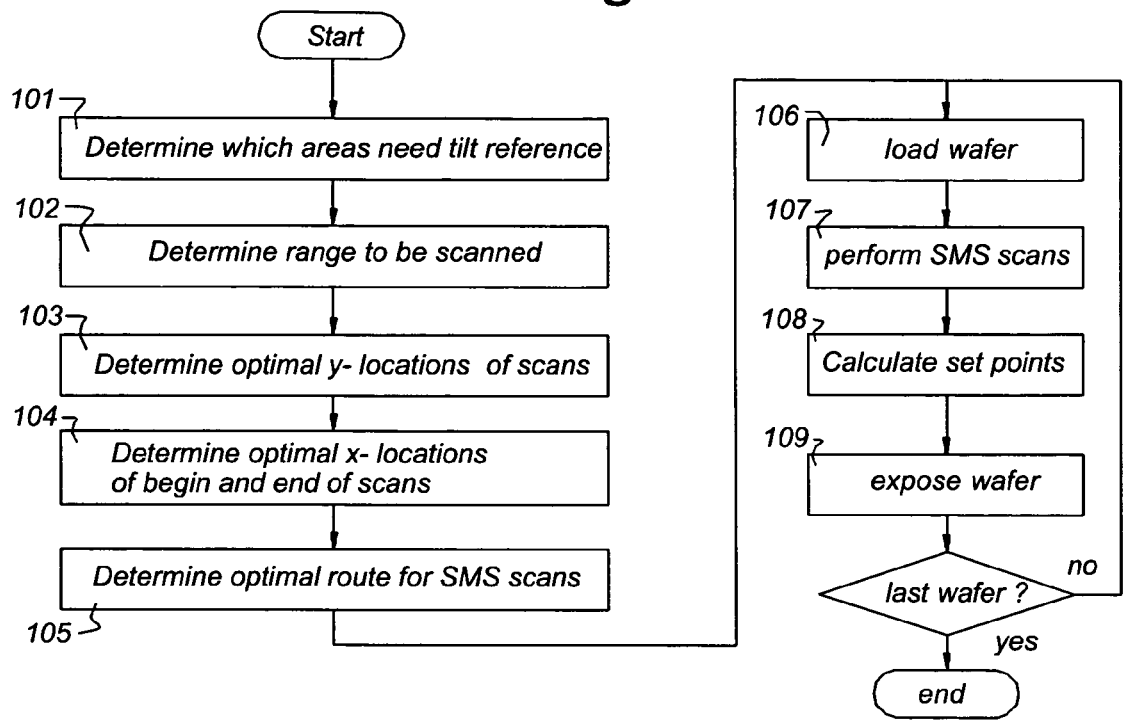
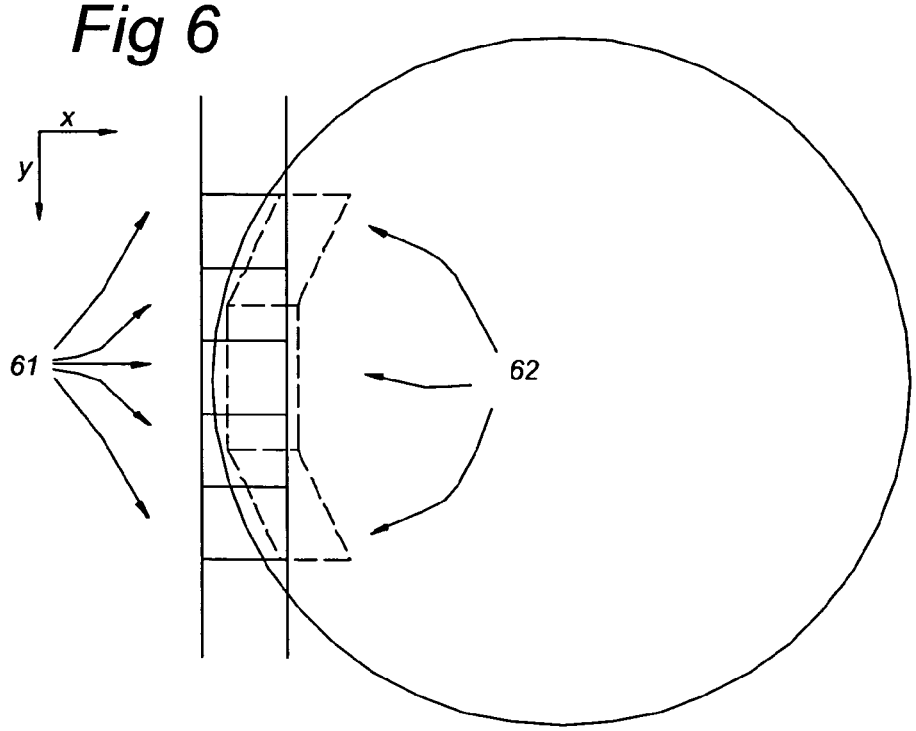

ASSEMBLY COMPRISING A SENSOR FOR DETERMINING AT LEAST ONE OF TILT AND HEIGHT OF A SUBSTRATE, A METHOD THEREFOR AND A LITHOGRAPHIC PROJECTION APPARATUS

BACKGROUND OF THE INVENTION

This application claims priority to European Patent Application No. 03075704.1, filed Mar. 11, 2003, herein incorporated by reference in its entirety.

1. Field of the Invention

This invention relates to lithographic apparatus and methods.

2. Description of Related Art

The term "patterning structure" used herein should be broadly interpreted as referring to a structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below).

Examples of Such Patterning Structure Include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic apparatus (e.g. lithographic projection apparatus) can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon substrate) that has been coated with a layer of radiation-sensitive material (resist). In general, a single substrate will contain a whole network of adjacent target portions that are successively irradiated via the projection system, one at a time.

In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a substrate stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In a lithographic projection apparatus, disc shaped objects (substrates) may be used onto which a lithographic pattern is projected. To prevent aberrations, it may be desirable to project the pattern on the substrate without the normal to the substrate making an angle with the direction of a projection beam (tilt).

In order to obtain information on the tilt of the substrates, a sensor may be used to perform a measurement scan which maps the tilt of the substrate as a function of position. However, near the edge of a substrate in a lithographic projection apparatus, the sensor, having finite sensing areas, (hereafter referred to as spots), may not properly measure tilt of a target portion. In order to expose accurately, accurate local information about the height and tilt is desirable.

Although specific reference may be made in this text to the use of an apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively. A wafer is only an example of a type of substrate.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

SUMMARY

An assembly according to one embodiment of the invention includes a sensor for determining at least one of tilt and height of a surface of a substrate in a lithographic projection apparatus, the substrate being moveable along at least one path substantially parallel to the surface of the substrate with respect to the sensor, the lithographic projection apparatus having an exposure scanning direction, the assembly being arranged to move the substrate relative to the sensor along the at least one path and to provide measurement data about the at least one of tilt and height along the at least one path, the assembly including a memory for storing the measurement data for use during a later exposure of the substrate by the lithographic projection apparatus wherein the at least one path of the substrate is at least partly at an angle to the exposure scanning direction.

In an embodiment of the invention, there is provided an assembly for determining at least one of tilt and height of a surface of a substrate in a lithographic apparatus, the assembly including:
 a substrate table configured to move the substrate along at least one path substantially parallel to the surface of the substrate;
 a sensor configured to measure the at least one of tilt and height along the at least one path; and
 a memory configured to store measurement data of the sensor for use during a later exposure of the substrate by the lithographic apparatus,
 wherein the at least one path of the substrate is at least partly inclined with respect to an exposure scanning direction of the lithographic apparatus.

A lithographic projection apparatus according to an embodiment of the invention includes:
a radiation system to form a projection beam of radiation, from radiation emitted by a radiation source,
a support structure constructed to hold patterning structure, to be irradiated by the projection beam to pattern the projection beam,
a substrate table constructed to hold a substrate, and
a projection system constructed and arranged to image an irradiated portion of the patterning structure onto a target portion of the substrate, wherein the lithographic projection apparatus includes an assembly as described above.

In an embodiment of the invention, there is provided a lithographic projection apparatus including:
 a radiation system configured to supply a beam of radiation;
 a support structure configured to support a patterning structure, the patterning structure configured to pattern the beam of radiation according to a desired pattern;
 a substrate table configured to support a substrate and to move the substrate along at least one path substantially parallel to a surface of the substrate; a projection system constructed and arranged to project the patterned beam of radiation onto a target portion of the substrate, and
 an assembly for determining at least one of tilt and height of a surface of a substrate in a lithographic projection apparatus, the assembly including:
 a sensor configured to measure the at least one of tilt and height along the at least one path; and
 a memory configured to store measurement data of the sensor for use during a later exposure of the substrate by the lithographic projection apparatus,
 wherein the at least one path of the substrate is at least partly inclined with respect to an exposure scanning direction of the lithographic projection apparatus.

A method, according to an embodiment of the invention, for determining at least one of tilt and height of a surface of a substrate in a lithographic projection apparatus includes:
providing a substrate table constructed to hold a substrate,
providing a sensor,
providing a memory,
the substrate table and the sensor being moveable along at least one path substantially parallel to the surface of the substrate with respect to each other, the lithographic projection apparatus having an exposure scanning direction, the method further including:
moving the substrate relative to the sensor along the at least one path, while providing measurement data about the at least one of tilt and height along the at least one path,
storing the measurement data in the memory for use during a later exposure of the substrate by the lithographic projection apparatus, wherein the at least one path of the substrate is at least partially at an angle to the exposure scanning direction.

In an embodiment of the invention, there is provided a method for determining at least one of tilt and height of a surface of a substrate in a lithographic projection apparatus, the method including:
moving the substrate along at least one path substantially parallel to the surface of the substrate;
providing measurement data about the at least one of tilt and height along the at least one path; and
storing the measurement data in a memory for use during a later exposure of the substrate by the lithographic projection apparatus
wherein the at least one path of the substrate is at least partially inclined with respect to an exposure scanning direction of the lithographic projection apparatus An assembly according to an embodiment of the invention includes a sensor for determining at least one of tilt and height of a surface of a substrate in a lithographic projection apparatus, the substrate being moveable along at least one path substantially parallel to the surface of said substrate with respect to the sensor, the sensor having a plurality of sensing spots, the lithographic projection apparatus having an exposure scanning direction, the assembly being arranged to measure with the sensor along the at least one path and to provide measurement data about the at least one of tilt and height along the at least one path, the assembly including a memory for storing the measurement data for use during a later exposure of the substrate by the lithographic projection apparatus, the substrate having an edge contour, wherein the assembly is arranged to measure with a predetermined subset of the sensing spots substantially along the inside of at least part of the edge contour of the substrate.

In an embodiment of the invention, there is provided an assembly for determining at least one of tilt and height of a surface of a substrate in a lithographic projection apparatus, the assembly including;
a substrate table configured to move the substrate along at least one path substantially parallel to the surface of the substrate;
a sensor configured to measure the at least one of tilt and height along the at least one path, the sensor including a plurality of sensing spots; and
a memory configured to store measurement data of the sensor for use during a later exposure of the substrate by the lithographic projection apparatus,
wherein the sensor is configured to measure the at least one of tilt and height with a predetermined subset of the plurality of sensing spots when one or more sensing spots are directed on or outside an edge contour of the substrate.

In yet another embodiment of the invention, there is provided an assembly for determining at least one of tilt and height of a surface of a substrate in a lithographic apparatus, including:
a substrate table configured to move the substrate along at least two paths substantially parallel to the surface of the substrate; and
a sensor configured to measure the at least one of tilt and height along each of the at least two paths,
wherein a direction of each of the at least two paths of the substrate is substantially parallel to a direction of a local tangent to a part of an edge contour of the substrate proximate to the path,
and wherein the at least two paths are contiguous and are inclined with respect to each other.

BRIEF DESCRIPTION OF THE DRAWINGS

The invention will now be explained in connection with the accompanying drawings, which are only intended to show examples and not to limit the scope of protection, and in which:

FIG. 5 describes a sequence to automatically perform and use measurement scans of an embodiment of the present invention;

FIG. 6 shows how tilt is determined in accordance with an embodiment of the present invention as shown in FIG. 5, and FIG. 7 describes a sequence to automatically perform and use measurement scans according to an embodiment of the present invention.

DETAILED DESCRIPTION

Figure 1:
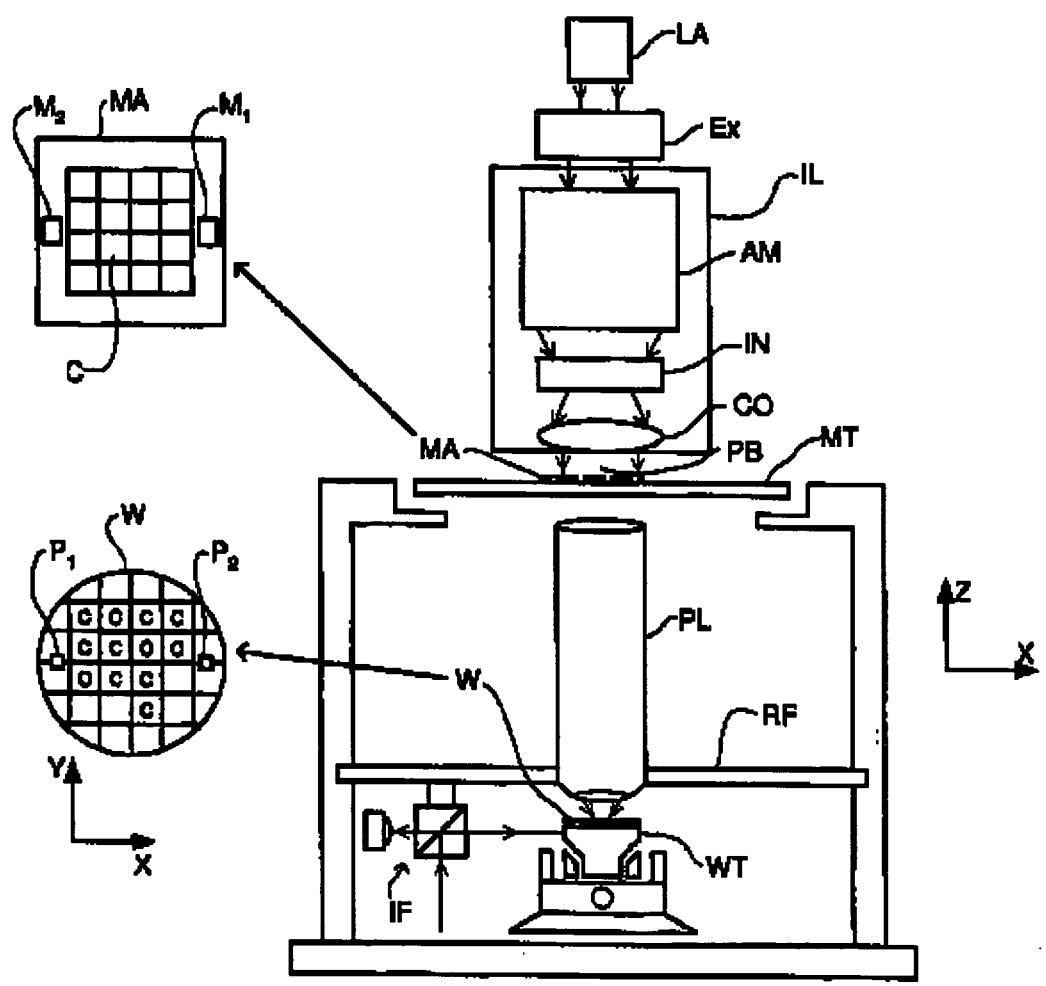
FIG. 1 is a schematic general overview of a lithographic projection apparatus according to an embodiment of the invention.

In several embodiments of the invention, there is provided a device that is configured, and a method that enables, to measure the tilt of a substrate more closely to the edges of a substrate such that less error prone extrapolation is required.

At least some embodiments of the present invention may be applied to make possible a more accurate determination of height and/or tilt of the substrate. In an embodiment of the invention, a measurement scan which maps the height and/or tilt of the substrate along a path is at least partly at an angle (the angle not being 0° or 180°) to the exposure direction.

In an embodiment of the invention there is provided an assembly for determining at least one of tilt and height of a surface of a substrate in a lithographic projection apparatus, the assembly including a substrate table configured to continuously move the substrate along at least one path substantially parallel to the surface of the substrate; a sensor configured to measure the at least one of tilt and height along the at least one path; and a memory configured to store measurement data of the sensor for use during a later exposure of the substrate by the lithographic projection apparatus, wherein the at least one path of the substrate is at least partly inclined with respect to (i.e. is in a direction that forms an angle not equal to 180 degrees with) an exposure scanning direction of the lithographic projection apparatus.

In a further embodiment of the invention, the sensor is configured to measure the at least one of tilt and height substantially along at least part of the edge contour of the substrate. Here, in particular, the substrate can be considerably curved, which means that an adequate curvature assessment is desirable here.

In a further embodiment of the invention, the sensor measures the at least one of tilt and height along the edge contour of the substrate in one go. This results in a faster determination of the tilt and/or height near the edges of a substrate.

In a further embodiment of the invention, the sensor is arranged or configured, while measuring (or during a measurement of the at least one of tilt and height), to approximate the geometry of the edge contour by measuring in at least one of the following ways:

along a plurality of straight lines that together follow the edge contour and along a step-by-step path along the edge contour and along a contour substantially equal in shape to the edge contour.

An optimum between a good approximation of the tilt and/or height closer to the substrate edge contour and a fast measurement is thus obtained.

In a further embodiment of the invention, the assembly is arranged to measure with the sensor along a plurality of subsequent paths having gaps between them in which no measurement is performed. Changing the direction of movement of the substrate table may induce unwanted vibrations that disturb accurate measurement. In order to eliminate the effect of these vibrations, the measurement may be temporally interrupted when a first path is completed and the direction of movement of the substrate table is adjusted. Only when a reasonable steady movement is settled, the measurement is continued. This results in gaps in between adjacent paths.

In a further embodiment of the invention, the sensor includes a sensor having at least one sensing spot configured to measure height. This sensor is switchable between an on and an off state, which switching is effected as a function of the position of the sensor. Depending on the position of the spots of the sensor on the substrate area, the sensor selects which spot to use, to derive a tilt from the measured target area.

In a further embodiment of the invention, the sensor has a plurality of sensing spots. In this embodiment, the assembly is arranged to measure the at least one of tilt and height only with a subset of the sensing spots along at least part of said at least one path. For instance, in case a certain subset of sensing spots are known to provide more accurate measurements, this specific subset may be used in order to obtain more accurate data, allowing determination of a more accurate tilt.

In a further embodiment of the invention, the substrate includes a target portion near the edge contour. In this embodiment, during later exposure of the target portion, the stored measurement data from a plurality of paths is used. This has the advantage that the scan length can be adjusted at will and can be optimally chosen in order to have a balance between (as low as possible) a few number of scans (which is minimally time consuming) and scanning as close as possible to the edge of the substrate, which is required for an accurate measurement of the tilt at these exposure locations. This means that an individual, separate, scan is not necessarily needed to obtain the tilt information for every exposure location (one-to-one relation). For instance, if each exposure location extends over a relatively limited area, it may be possible to use the data of one scan for 3 exposure fields. On the other hand, if the exposure locations are relatively large, the information obtained in more than one scan may be used to determine the tilt of a particular exposure field.

In an embodiment of the invention, there is provided a lithographic projection apparatus including a radiation system configured to supply a beam of radiation; a support structure configured to support a patterning structure, the patterning structure configured to pattern the beam of radiation according to a desired pattern; a substrate table configured to support a substrate and to continuously move the substrate along at least one path substantially parallel to a surface of the substrate; a projection system constructed and arranged to project the patterned beam of radiation onto a target portion of the substrate, and an assembly for determining at least one of tilt and height of a surface of a substrate in a lithographic projection apparatus, the assembly including a sensor configured to measure the at least one of tilt and height along the at least one path; and a memory configured to store measurement data of the sensor for use during a later exposure of the substrate by the lithographic projection apparatus, wherein the at least one path of the substrate is at least partly inclined with respect to an exposure scanning direction of the lithographic projection apparatus.

In a further embodiment the invention, the lithographic projection apparatus is arranged to project the radiation beam on a focal plane, to read the measurement data from the memory and to use the measurement data to adjust the position of the substrate to bring a target portion located on the substrate upon irradiation by the radiation beam optimally in the focal plane of the radiation beam.

Since the positional relation between the substrate tilt and/or height and a die on the substrate is stored in a memory of the lithographic projection apparatus, it may be retrieved during scanning and projection of the die. This means that during exposure operation of the scanner there is no need to gather extra tilt and/or height information by way of e.g. additional measurement scans which speeds up the lithographic process.

In a further embodiment of the invention, the sensor of the lithographic projection apparatus, while measuring (or during a measurement of the at least one tilt and height), irradiates the substrate with at least one spot, a maximum distance between the at least one spot and the edge contour being in a range of about 0.5 mm to 4 mm. In another embodiment of the invention, a maximum distance between the at least one spot and the edge contour is in a range of about 1.5 mm to 2.5 mm.

In an embodiment of the invention, there is provided a method for determining one of tilt and height of a surface of a substrate in a lithographic projection apparatus, the method including continuously moving the substrate along at least one path substantially parallel to the surface of the substrate; providing measurement data about the at least one of tilt and height along the at least one path; and storing the measurement data in a memory for use during a later exposure of the substrate by the lithographic projection apparatus wherein the at least one path of the substrate is at least partially inclined with respect to an exposure scanning direction of the lithographic projection apparatus.

According to a further embodiment, the method also includes providing a radiation system to form a projection beam of radiation, from radiation emitted by a radiation source, providing a support structure constructed to hold patterning structure, to be irradiated by the projection beam to pattern the projection beam,scanning the substrate in an exposure scanning direction, using the measurement data during exposure of the substrate.

According to a further embodiment of the invention, the method also includes generating the radiation beam by the source and projecting the radiation beam on a focal plane on the substrate, reading the at least one of tilt and height data from the memory and using the at least one of tilt and height data to adjust the position of the substrate to bring a target portion located on the substrate upon irradiation by the radiation beam optimally in the focal plane of the radiation beam.

According to an embodiment of the invention, the method further includes: determining the at least one of tilt and height on at least one substrate of a batch of substrates and using the at least one of tilt and height of the at least one substrate to estimate tilt and height for all (or the remaining of the) substrates of the batch.

Substrates from a single batch usually have similar shapes towards the edge. The determined tilt and height on a single substrate could then be used for further substrates. Such a method is much less time consuming.

In an embodiment of the invention, there is provided an assembly for determining at least one of tilt and height of a surface of a substrate in a lithographic projection apparatus, the assembly including a substrate table configured to continuously move the substrate along at least one path substantially parallel to the surface of the substrate; a sensor configured to measure the at least one of tilt and height along the at least one path, the sensor including a plurality of sensing spots; and a memory configured to store measurement data of the sensor for use during a later exposure of the substrate by the lithographic projection apparatus, wherein the sensor is configured to measure the at least one of tilt and height with a predetermined subset of the plurality of sensing spots when one or more sensing spots are directed on or outside an edge contour of said substrate.

The predetermined subset of sensing spots may be the sensing spots that are known to provide the most accurate measurements. When a level sensor is used with eight sensing spots (two rows with four sensing spots), the inner four (i.e. the inner two of each row) may be the predetermined subset of sensing spots. By measuring with these four sensing spots closely to the edge contour and thus projecting two sensing spots outside the edge contour, the most accurate measurement data is obtained close to the edge contour. This enables accurate tilt determination in the area close to the edge contour.

FIG. 1 schematically depicts a lithographic projection apparatus 1 according to a particular embodiment of the invention. The apparatus includes:

a radiation system Ex, IL, configured to supply a projection beam PB of radiation (e.g. EUV radiation with a wavelength of 11–14 nm). In this particular case, the radiation system also includes a radiation source LA;

a first object table (mask table) MT provided with a mask holder and configured to hold a mask MA (e.g. a reticle), and connected to first positioning device PM that is configured to accurately position the mask with respect to item PL;

a second object table (substrate table) WT provided with a substrate holder and configured to hold a substrate W (e.g. a resist-coated silicon substrate), and connected to second positioning device PW that is configured to accurately position the substrate with respect to item PL; and a projection system ("lens") PL configured to image an irradiated portion of the mask MA onto a target portion C (e.g. comprising one or more dies) of the substrate W.

As here depicted, the apparatus is of a transmissive type (i.e. with a transmissive mask). However, in general, it may also be of a reflective type, for example (with a reflective mask). Alternatively, the apparatus may employ another kind of patterning structure, such as a programmable mirror array of a type as referred to above.

The source LA (e.g. a laser-produced plasma or a discharge plasma EUV radiation source) produces a beam of radiation. This beam is fed into an illumination system (illuminator) IL, either directly or after having traversed a conditioner, such as a beam expander Ex, for example. The illuminator IL may comprise adjusting device AM that is configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The range of embodiments of the current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning structure PW (and interferometric measuring device IF), the substrate table WT can be moved accurately, e.g. so as to position different target portions C in the path of the beam PB. Similarly, the first positioning structure PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a substrate stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The edge contour of the substrate forms the boundary between the area on a substrate where height and tilt measurements can be performed and the area on the substrate where it is not possible to perform such measurements, particularly near the outer boundary of the substrate.

Near the edge of a substrate in a lithographic apparatus, the sensor, having finite sensing areas, (hereafter referred to as spots), may not properly measure tilt of a target portion, since some measurement spots of the sensor extend into the edge exclusion zone, also called focus edge clearance (FEC), i.e. the zone outside the edge contour. The tilt of a neighboring, previously measured area of the substrate may be employed in such a case. Such a previously measured neighboring area of the substrate may be a neighboring target portion, but may also be a neighboring area within the same target portion, where reliable tilt measurements could still be obtained. This, however, may result in considerable errors in tilt for the target portions, or part of the target portions, to be exposed, because of the relatively large distance between the area where tilt is measured and the area where this tilt is applied, especially for substrates that slope up or down towards the edges (edge roll-off).

At the moment, the position of the substrate and its support structure can be shifted to a position in which measurement spots of the sensor are no longer within the FEC. This means that the sensing area of the sensor is no longer aligned with the actual target portion to be exposed. Such a shifting operation to measure tilt for application at the non-shifted target portion is described in U.S. Pat. No. 5,412,214 for a lithographic stepper. According to this document, if the level sensor has part of its sensing spots within the FEC, and the tilt can thus no longer be determined or can no longer be determined with sufficient accuracy, the substrate and the sensor are shifted with respect to each other. As a result of this, more sensing spots of the sensor are projected on the area of the substrate where (reliable) measurements can be obtained. Due to the finite dimensions of the measurement trajectories of the tilt measurement scans in this document, the start (or end point) of the measurement scan, while initially (or finally) touching FEC may be finally (or initially) several millimeters from the FEC. This does not yield the required accuracy information on the tilt near the edges of the substrate, which can be, as practical experience shows, considerably curved.

European patent application EP 1 037 117 A2 in the name of the applicant describes a pre-measurement scan tilt determination. It describes a method to measure the global level tilt. This global tilt is not used directly during exposure of the substrate but is only used as a "starting point" for a levelling action. In order to obtain the global level tilt, first the substrate is vertically moved in order to bring the substrate within the linear or linearized range of the measurement spots of the level sensor. Then the substrate is moved so that the central measurement spot traverses a path around the inside of the perimeter of the total exposure area. Only information from this single spot is captured. This global level contour path is a winding path following the edges of the exposure areas quite closely, but may also be a circular path following the inside of the edge contour. The sensor obtains height measurements only at certain points along this global level contour path, resulting in a so-called global level contour.

The global level contour obtained at these specific points is used to get a rough impression of the height and tilt of the entire substrate. During subsequent tilt measurement scans, this information is used to bring the substrate surface on a substrate stage globally into a range in which the sensor has a linear(ized) mode of operation. However, this procedure may only provide global information about the substrate, but this information may not be accurate enough to be used during exposure.

Figure 2:
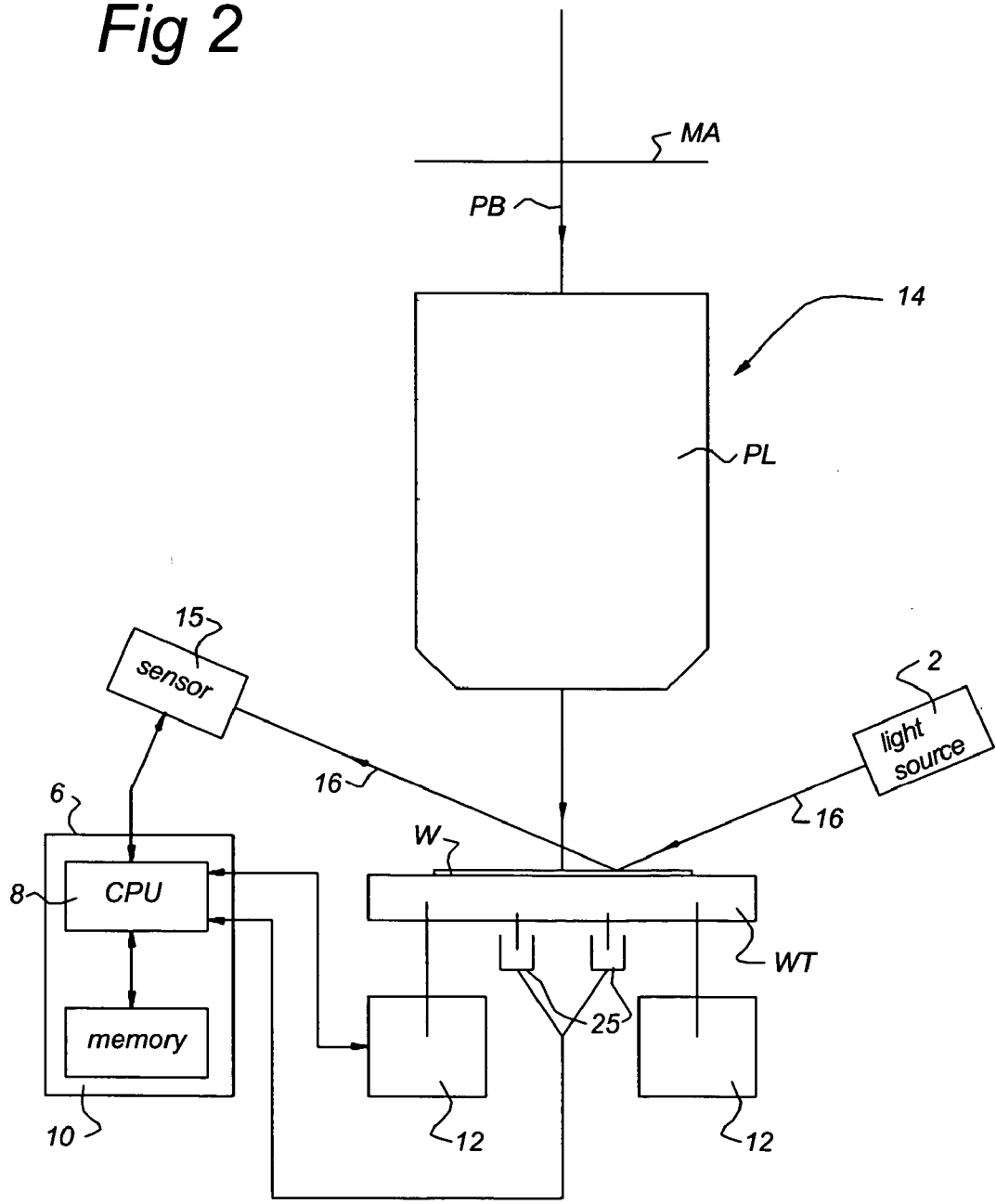
FIG. 2 is a more detailed view of the lithographic projection apparatus of FIG. 1.

In FIG. 2, a section 14 between the mask MA and the substrate table WT of the lithographic projection apparatus 1 is shown. In the section 14, the so-called projection system PL, from FIG. 1 is present. The projection system PL contains several elements to guide and condition the projection beam PB of radiation, as is known to persons skilled in the art. After passing the projection system PL, the projection beam PB of radiation hits the surface of the substrate W on the substrate table WT. The substrate table WT is connected to actuators 12. These actuators 12 are connected to a control device 6 with a central processing unit (CPU) 8 and a memory 10. The central processing unit 8 further receives information from sensors 25 measuring the actual position of the substrate table WT or substrate table holder by electric (capacitive, inductive) or optical, e.g. interferometric (as shown in FIG. 1) means. The CPU 8 also receives input from a sensor 15 which measures the height and/or tilt information from the target area on the substrate where the projection beam PB hits the substrate surface. This sensor 15 is part of a level sensor, that includes a sensor 15 and a light source 2, as will be explained below. This assembly will hereinafter further referred to as Level Sensor, 2, 15.

The level sensor may include, for example, an optical sensor; alternatively, a pneumatic or capacitive sensor (for example) is conceivable. In an embodiment of the invention, the sensor is an optical sensor making use of Moiré patterns formed between the image of a projection grating reflected by the substrate surface and a fixed detection grating as described in U.S. Pat. No. 5,191,200. In an embodiment of the invention, the level sensor 2, 15 is configured to measure the height of a plurality of positions simultaneously and may measure the average height of a small area for each position, so averaging non-flatness of high spatial frequencies. This arrangement includes a light source 2, projection optics (not shown), and detection optics (not shown) and detection device, here called a sensor 15. The sensor 15 generates a height dependent signal which is fed to the CPU 8.

It will be understood by a person skilled in the art; that the measurement data may either be sensor readings or positional information of the substrate support structure, or combinations of the two.

The level sensing method uses at least one sensing area and measures the average height of a small area, referred to as a spot. Depending on the position of the spot on the substrate area, a selection mechanism selects the spot or spots, which are applicable to derive height and/or tilt information from a measured target area.

Figure 3A:
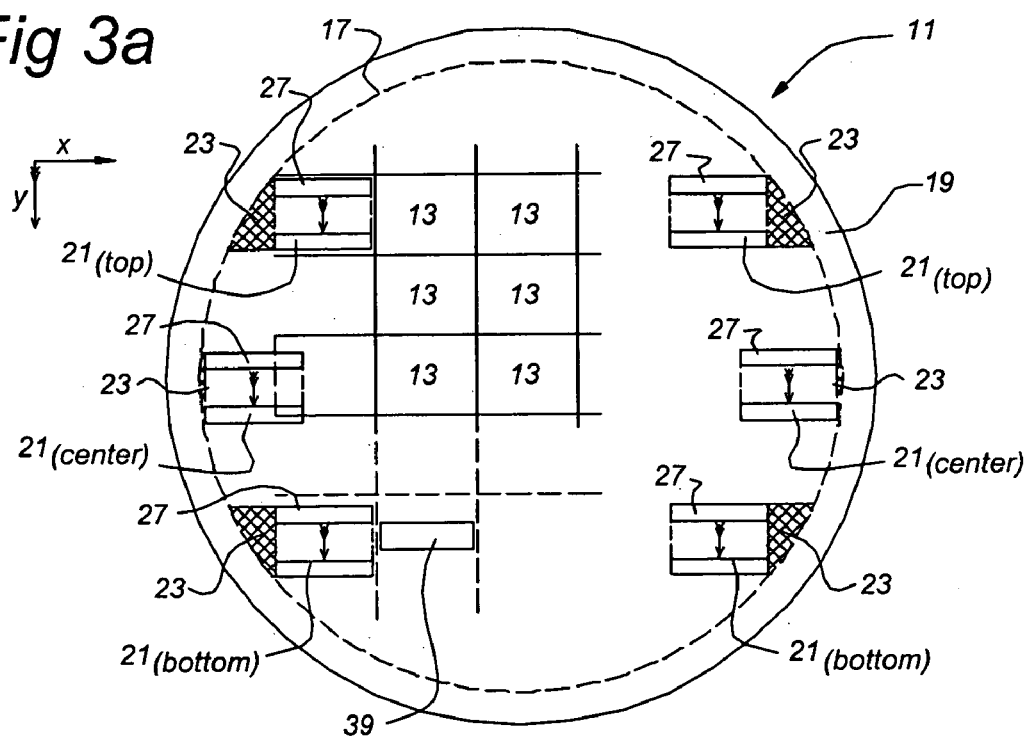
FIG. 3a shows an example of locations on a substrate where tilt is determined.

In FIG. 3a, the target area is indicated with reference numeral 13. In this specific case the level sensor 2, 15 has 8 spots which are measured on a substrate 11 in order to determine the local height and tilt of an illuminated part of the target area 13 and to achieve sufficient averaging over the illuminated part of the target area 13. It should be understood that level sensors with an other number of spots may be applied instead.

Further shown in FIG. 3a is a slit shaped area, that is briefly referred to as slit 39. The slit 39 is the area illuminated during imaging in successive target areas 13 during scanning. In the scanning process, the slit 39 moves over the substrate surface in the y direction several times in series next to one another until the entire substrate surface is covered by images of the reticle, as is known to a person skilled in the art. The slit 39 is shaped as a rectangle. According to FIG. 3*a*, the length dimension of the slit 39 in the x direction is substantially equal to the length in the x direction of a target area 13. It will however be understood by a person skilled in the art that the length dimension of slit 39 may also be smaller or bigger with respect to the length in the x direction of a target area 13. The width (along the y direction) of the slit 39 is much smaller than its length.

FIG. 3*a* also shows level scan areas 21 used in the prior art by the level sensor 2, 15 to derive height and tilt data at the edge of the substrate 11. A level sensor spot area 27 is schematically indicated with reference number 27. The level sensor spot area 27 is scanned over the substrate surface along a predetermined path in the exposure direction y as indicated with an arrow.

During the scanning motion while exposing, moving the substrate 11 with respect to the focal plane, the substrate table WT is controlled by the actuators 12 driven by the CPU 8.

The actuators 12 controlled by the control device 6, are used to adjust the position of the substrate table WT in height and tilt, and hence the substrate 11, to ensure that the substrate is in the focal plane during imaging, preventing defocus. One way to determine the required amount of position adjustment is described, for example, in U.S. Pat. No. 5,191,200.

What is meant by defocus is the way in which the substrate 11 deviates from the focal plane of the projection beam PB of radiation. In normal operation, the level sensor 2, 15 measures heights, vertical position of the substrate surface at multiple points, by means of multiple sensing areas (spots). The height readings of the spots are fed to the CPU 8, which uses these height values to derive an average height for the illuminated target area to be positioned. If it is possible, e.g. from multiple height readings at different x and y positions of the illuminated target area, a desired height and tilt at which the substrate 11 should be positioned could be derived. These desired height and tilt of the substrate 11 is then provided by the CPU 8 by controlling the height and tilt of the substrate table WT by activating the actuators 12. In this way, a closed loop control mechanism to position the actual illuminated part of the target area in the focal plane is achieved. During the exposure scan, the target area's illuminated part is continuously positioned in the focal plane by height readings supplied by the level sensor spot covering the slit shape exposure area.

Measurement data as to local deviations from the focal plane, for example level sensor readings, and/or substrate table positions (in x, y and z direction, as well as tilt around the x and y axis) as measured by sensors 25, are stored in the memory 10 during the exposures or measurement of target areas for possible later use by the arrangement during the exposure or measurement of another target area. Target areas located close to the edge contour of the substrate cannot be measured accurately anymore in case spots (sensing areas) of the level sensor 2, 15 are on the outside of the edge contour, i.e. are in the area of the substrate where it is not possible to apply level sensor measurements. These spots may fall within the FEC, or may also fall completely outside the surface of the substrate. In that case, the level sensor 2, 15 may no longer provide measurement data that allows accurate determination of the height and/or tilt and it can become difficult to keep closed loop control on the measured data by the level sensor 2, 15 for positioning the substrate 11 in height and/or tilt during imaging a reticle on the substrate 11. Positioning of the substrate 11 in the focal plane for minimizing defocus then requires data measured elsewhere on the substrate 11. Therefore the stored data in the memory 10, stored during previously measured areas on the substrate, is retrieved and used for calculating, for example by means of extrapolation, height and tilt values to be used to control the substrate height.

Due to the geometry of the slit 39, a local tilt of the substrate 11 in the y direction (i.e. a local rotation around the x axis) of the target area 13 is relatively less important than a local tilt in the x direction (i.e. a local rotation around the y axis) of the target area 13. In this latter case, it may desirable to do an adjustment for the tilt as accurately as possible. Therefore, it may be desirable to know the tilt in the x direction.

There are minimum requirements for the combination of valid spots in order to determine a reliable tilt. If these minimum requirements are not met on a certain location it may be difficult to measure the tilt at that location. In that case the tilt measured on nearby reference area is used. This reference area can either be a part of the same exposure field or a different exposure.

Figure 3B:
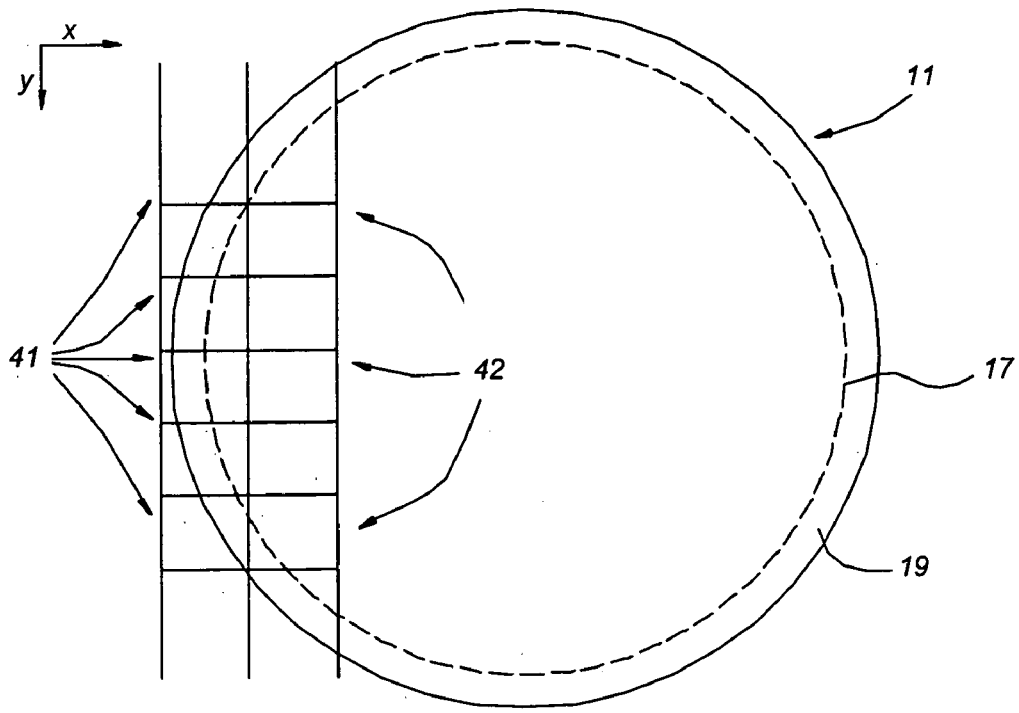
FIG. 3b shows the edge contour of a substrate in greater detail.

Using reference fields is explained with reference to FIG. 3*b*. In FIG. 3*b*, the edge contour 17 is shown in greater detail. FIG. 3*b* shows a plurality of edge fields 41 located at the edge of the substrate 11, and reference fields 42 located adjacent to the edge fields 41. Substrates can have a roll-off towards the edge contour 17. As a result of such substrate curvature, the tilt on an edge field 41 can be very different from the tilt of the reference field 42. Conventionally, the tilt as measured for reference field 42 may also be used for edge field 41. However, due this potential difference in actual tilt this may result in defocus on edge field 41.

Figure 3C:
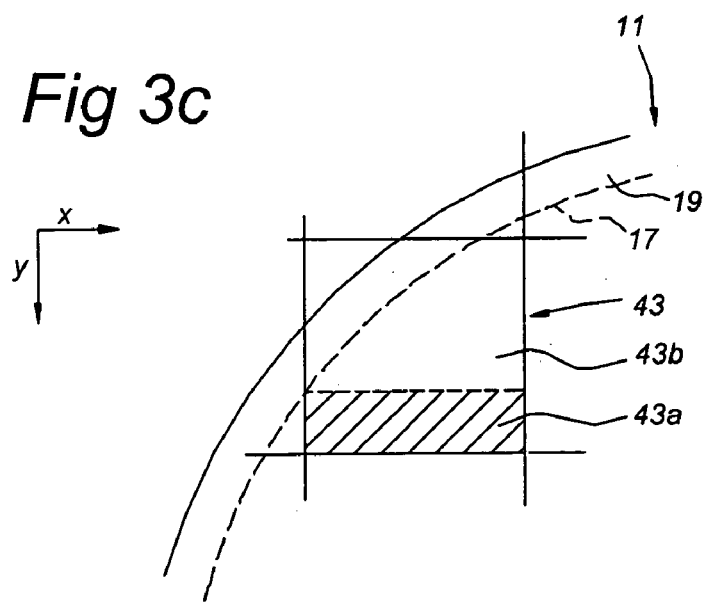

Using a reference area on the same exposure field is explained with reference to FIG. 3*c*. FIG. 3*c* shows an edge field 43 adjacent to the edge contour 17. The lower part of the field, indicated with 43*a*, indicated with diagonal shading, can successfully and completely be measured with the level sensor 2, 15. For this lower part 43*a*, all the sensing spots of the level sensor 2, 15 are projected within the edge contour 17. However, in the upper part of the field, indicated with 43*b*, not all the sensing spots of the level sensor 2, 15 will be within the edge contour. In this tilt information from the lower part 43*a* is used to obtain an estimate for the tilt in the upper part 43*b*, instead of using tilt information from a neighboring, reference field 42.

If the substrate is curved the tilt on the upper part 43*b* can be very different from the tilt of the lower part 43*b*.

Both the approaches may be summarized by stating that for areas on which the tilt cannot be determined with sufficient accuracy, tilt information from a neighboring reference area, formed by at least part of the same and/or an other field on the substrate, may be used. With both approaches, the tilt on the reference area can be very different from the tilt on the area where tilt cannot be measured, resulting in defocus.

This tilt difference is primarily present at the left and right side of the substrate (These locations are also referred to as "three o'clock" and "nine o'clock" positions of the substrate 11) as will be explained below. As mentioned before, it is desirable that the applied tilt in the x direction accurately matches the local substrate tilt. Since substrate roll off is in most cases rotationally symmetric, in the upper and lower areas of the substrate 11 (also referred to as "6 o'clock" and "12 o'clock") there will mainly be tilt deviations in the y direction (i.e. around the x-axis). In addition, because the scans are performed in y direction and the size of the LS spots in the y direction is relatively small, the distance to a reference area where the tilt still can be measured is relatively small here. So, because both the extrapolation distance and (in most cases) the rate of change of the tilt in x direction are small, the extrapolation is relatively accurate. At the left and right side of the substrate however the tilt in x direction shows larger deviations towards the edge and for a particular edge field, the closest area where tilt is still measured may be the neighboring field. Therefore, the defocus as a result of substrate curvature is most prevailing at edge fields at the left and right side of the substrate.

Now returning to FIG. 3b, to reduce the tilt error, it is desirable to reduce the extrapolation distance (the distance between the edge field 41 and the area where the tilt is measured). Currently, as shown in FIG. 3a, this can be done by performing an additional scan $21_{(center)}$ that can be used as reference area, as illustrated in FIG. 3a. Since no exposure is done during such a measurement scan this scan can be shifted with respect to the original reference field 42. To reduce the extrapolation distance, this scan is shifted to a location as close to the edge contour as possible, while ensuring that the spots required to measure tilt are valid, so that it is still possible to measure the tilt during the entire scan. By performing such a measurement scan the defocus can be reduced.

The measurement scans described above are performed in the normal scan direction: (y direction). Measurement scans that are located close to the central line on substrate (Y=0), like level scan area $21_{(center)}$ in FIG. 3a, are performed more or less parallel to the substrate edge. As a result, the distance to the edge is sufficiently constant during the entire scan. For level measurement scans above or below the central line of the substrate, like in level scan area $21_{(top)}$ and level scan area $21_{(bottom)}$, only at one end of the scan the spots of the level sensor 2, 15 touch the edge exclusion zone 19. Because of that, the distance of the level scan areas $21_{(top)}$ and $21_{(bottom)}$ to the edge of the substrate 11 at the beginning of the scan may be very different compared to the end of the scan in these areas. As becomes apparent from FIG. 3a, the shaded parts 23 of the substrate 1 are not taken into account for the tilt determination. The average extrapolation distance may therefore not be optimal and this area may not be optimally leveled.

Figure 4:
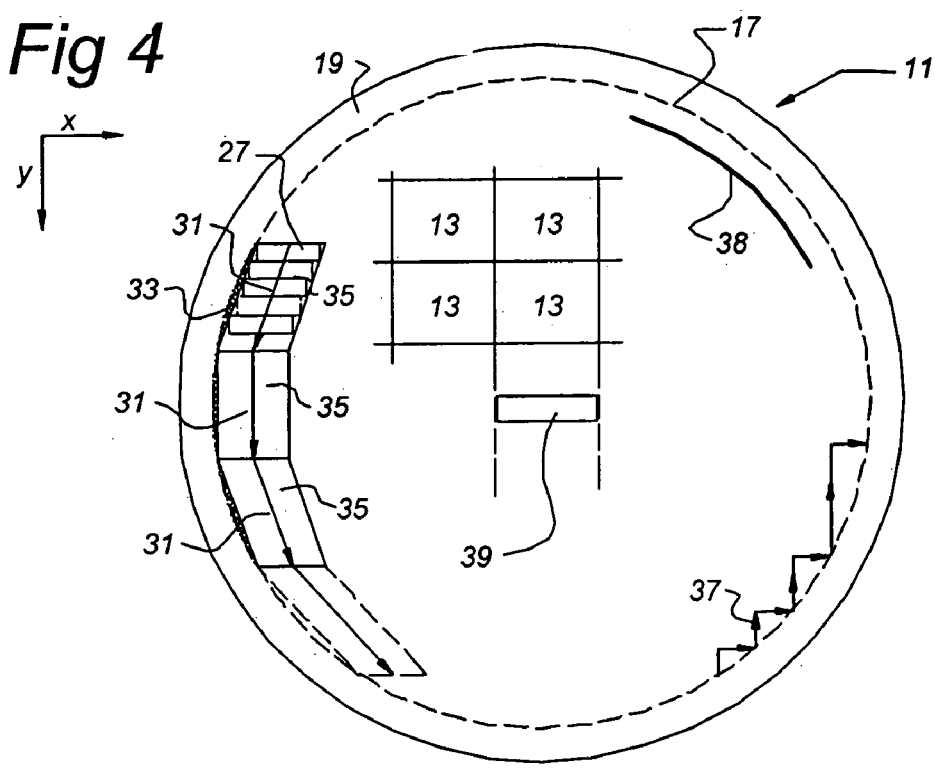
FIG. 4 shows how tilt is determined in accordance with an embodiment of the present invention.

An embodiment of the invention is now described with reference to FIG. 4. The tilt near the edge of the substrate 11 is determined by a tilt measurement that scans along a contour of consecutive straight paths 31 each covering an area 35. The contour as shown in FIG. 4 is formed by a plurality of connected paths 31, that may be at an angle with respect to the exposure direction y. However, it is also possible that the end point of a first path 31 does not coincides with the begin point of a second path and that gaps are present between the end and subsequent begin points. The reason for this is that changing the direction of movement of the substrate table induces unwanted vibrations that disturb accurate measurement. In order to eliminate the effect of this, the measurement may be temporally interrupted when a first path 31 is completed and the direction of movement of the substrate table is adjusted. Only when a reasonably steady movement is settled, the measurement is continued. This results in gaps in between adjacent paths 31. The level sensor spot area is again indicated with reference number 27. This level sensor spot area is continuously scanned along paths 31. FIG. 4 shows schematically five of such level sensor spot areas. However, this is not intended as five different measurements but as "images" of one level sensor spot area at discrete moments in time during the scan. Between the line 17 and the areas 35 a shaded area 33 is located.

Since the direction of the straight lines 31 are substantially parallel to the direction of local tangents on the edge contour 17, and thus may be at an angle with respect to the exposure direction y, the measurement areas 35 are much closer to the edge exclusion zone 19. The angle may vary along the perimeter of the substrate. At the three and nine o'clock positions this angle may be 0° (or 180°).

As a result, the centre of the scan is now located closer to the edge and also closer to the edge exclusion zone 19 where the tilt measurement is used. Therefore, the extrapolation distance is smaller and the tilt applied at the edge field 41 is more accurate than in the prior art arrangement of FIG. 3a (note: the edge fields 41 and reference fields 42 from FIG. 3b have not been repeated in FIG. 4 but are present there as well).

In case a level sensor 2, 15 is used with for instance 8 sensing spots, arranged in two parallel rows of four, from which the inner four are known to provide the most accurate measurements, it is also possible to shift the level sensor spot area such that the inner four sensing spots are located as close to the edge contour as possible. Only the inner spots are used to measure tilt. In this way the average position of the spots used to measure tilt is located closer to the edge of the substrate and the field where tilt cannot be determined. This approach may under certain circumstances result in a more accurate tilt determination.

These shifted measurement scans may be used for (parts of) target portions according to FIGS. 3b and 3c, but the information obtained by such a shifted level sensor spot measurement may also be used for areas on the substrate in which the tilt can already be determined by using the non-shifted level sensor spot measurements. In cases where a number of sensor spots fall within the FEC, a more accurate tilt may be determined using data obtained from a shifted measurement, depending on the specific circumstances. This is because with the shifted measurement the spots used to determine tilt are shifted as close as possible to the FEC, while in the non-shifted measurement a considerable distance can exist between the FEC and the outer most spot that can be used.

In an embodiment of the invention, it may be desirable that the end point of a path 31 is located near the starting point of a subsequent path 31 in a way that allows the substrate stage system to perform both scans 'in one go'. However, as already stated above, there may also be gaps present between the adjacent paths 31. According to a further embodiment the paths 31 may also partially overlap each other.

The level measurement may be carried out in one circular direction only (e.g.: clockwise or anticlockwise over the substrate 11). In that way, it is not necessary to stop or reverse the substrate table movement, which results in a faster measurement.

To allow scanning in a direction different from the default scan direction it may be desirable that the substrate table be able to perform the needed movements. Normal exposure scans are generally performed in the y direction, because the movement of the substrate table WT matches the movement of the mask table MT, which scans in the y direction. During level measurement scans, no exposures are performed and the mask table does not have to participate in these level measurement scans. Because of this, then, the scan direction does not necessarily have to be the y direction. Also, in order to scan in a different direction than the y direction, it may be desirable that the substrate table perform a controlled scan move in a random direction.

Alternatively, as indicated by a line 37 in FIG. 4, it is possible to measure the tilt in a level measurement scan along a step-by-step contour following the edge contour 17 of the edge exclusion zone 19. In an embodiment of the invention, a further alternative is a level measurement scan along a circular path 38 that follows the edge contour 17 as closely as possible.

In the above, the description has been directed to tilt determination, but it should be understood that the same approach/description can apply for the determination of height.

In FIG. 5, a flow chart to automatically perform and use the measurement scans is described, according to an embodiment of the invention. In step 101, it is determined on which areas of the substrate the tilt cannot be measured directly. These areas may be complete target portions, but may also be parts of target portions. These areas require a reference area. A reference area is an area on the substrate where it is possible to obtain a direct tilt measurement: no shifted measurement scans are needed here. Based on locations of the areas where tilt cannot be measured directly, in step 102, the range is determined that has to be covered by shifted level measurement scans. For each area selected in step 101, the required measurement scan range runs between the y position of the beginning of the area until the end of the area. The total scan y-range on each side of the substrate is a union of all these required scan ranges. In step 103, it is determined where the measurement scans must be placed to cover the entire required range. To minimize throughput impact, the number of scans is minimized, however the length of each measurement scan is not allowed to exceed a certain maximum, in an embodiment of the invention. This is done to limit the distance between the level sensor spots and the edge exclusion zone halfway the measurement scan. The y positions of beginning and end of the scans are placed in such a way that they match the beginning and end of the total required range. However, the number of measurement scans does not have to be equal to the number of fields selected in step 101. It is for instance possible to use one measurement path to obtain information that can be used for three areas on which the tilt cannot be determined directly. It is for instance also possible that for information on one area on which the tilt cannot be determined directly (parts of) several measurement paths are used. This all depends on the particular dimensions of the sensor and the areas.

In FIG. 6 it is illustrated that as a result it is possible that the data collected in measurement scans 62 is used for several areas on which the tilt cannot be determined directly 61. It is also possible that the required sample data of such an area 61 is collected in two different measurement scans 62. When the y locations of the beginning and end of the measurement scans are calculated in step 104 the x locations are determined, as explained in connection with FIG. 5. The x locations of these points are chosen such that at these points in the scan the required level sensor spots are just touching the edge exclusion zone. After step 104, both the x and y locations of the beginning and end of each measurement scan are known. The scan will be performed in a straight line between these two points. The order and scan direction in which the scans are performed is determined in step 105. To do this, the time the substrate table system needs to travel between scans for each possible order is calculated. The configuration, that requires the least time, is selected.

Then the processing of a batch of substrates can start. In step 106, a substrate is loaded on the substrate stage. Then, in step 107, the measurement scans are performed in the order determined in step 105. During these scans, the substrate tilt is measured with a dense sample grid and these samples are stored into memory 10. If all measurements are performed the tilt values to be used for the required areas are determined in step 108. For each area on which the tilt cannot be determined directly, the samples are selected from the measurement scans that lie within the y range between the beginning and the end of the edge field. In one possible implementation, these tilt values are then averaged, such that a constant tilt value may be applied during the exposure of the edge field. Another possibility is to perform a line fit to the tilt values and apply the tilt on the edge field according to a linear profile. Also other profiles can be used, for instance using a curve fit, averaging techniques, higher order polynomial fits, filtering of the measured signal (e.g. delete highest orders). It is also possible to use the signal as measured, without applying any form of processing. In the sequence described here, the sample range that is used for a certain area matches exactly the y boundaries of the field. It is also possible that this sample range only covers a part of the area on which the tilt cannot be determined directly or covers a larger range than the boundaries of the area on which the tilt cannot be determined directly.

In step 109, the substrate is exposed. For the area where the tilt cannot be measured directly, the profiles determined in step 108 are used. If the substrate is not the last substrate of the batch the flow continues with a next substrate in step 106.

In the sequence described in FIG. 5, all measurement scans are performed before starting the first exposure. Also other sequences are possible, as long as the areas that require tilt information from one or more shifted measurement scans are exposed after the measurement scans in which the tilt data is collected that is used to derive the tilt profile of said area, i.e. the measurement scans in the reference areas.

Figure 7:
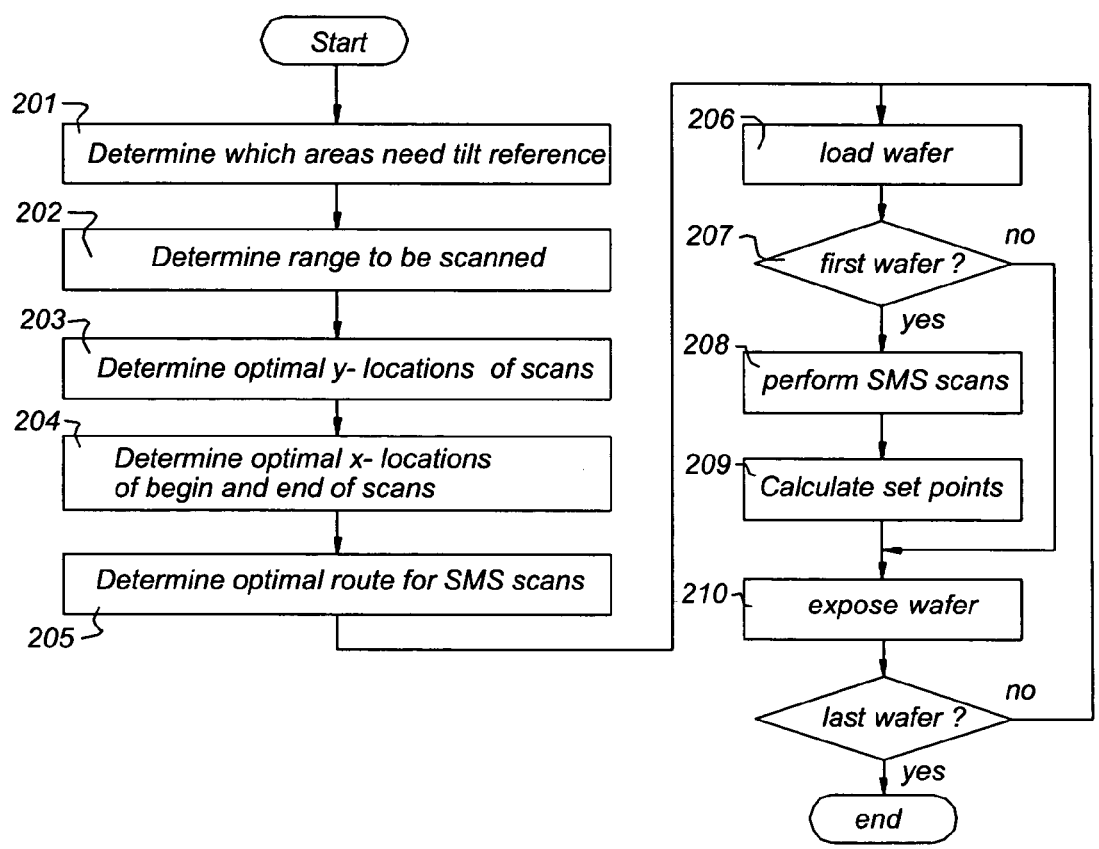

In some cases, the curvature on a process substrate is the same for all substrates in the same batch or the same process. In a second embodiment a different sequence is set for these cases. In this sequence, the measurement scans are only performed on the first substrate of a batch of substrates in order to reduce the throughput penalty. This sequence will be described with reference to FIG. 7. Steps 201 to 206 are the same as steps 101 to 106, respectively, in FIG. 5. In step 207 it is checked if the substrate to be exposed is the first substrate of the batch. If yes, step 208 and 209 are performed. In step 208 the measurement scans are performed in the same way as in step 107. In step 209 for each area, on which tilt cannot be measured, the tilt is calculated based on the measurement scans in the same way as in step 108. Also the tilt is calculated that would be used if no shifted measurement scans were performed, so based on a neighboring area. The difference between these two values is saved in memory 10 as a tilt offset. In step 210, these offsets are applied to the said areas on which the tilt cannot be determined directly. This is done for each substrate 11 of the batch. In this way, the effect of the curvature of the substrate 11 only has to be measured once, while the differences in global wedge of the substrate is still corrected for on each substrate of the batch, also for the said areas on which the tilt cannot be determined directly.

As already stated above, the shifted measurement scans may also be applied for areas for which tilt can be determined based on the measurements obtained by the level sensor 2, 15 based on the non-shifted measurements. In some cases, depending on the exact conditions, the tilt computed based on the shifted measurements may lead to a more accurate tilt. This may for instance be the case in situation where three of the eight sensing spots of the level sensor 2, 15 are in the FEC, and a fourth one is very near the edge contour, so does not form a very reliable measuring spot. In such a case it is very well possible to compute a tilt value based on five sensing spots, but a more reliable tilt can be determined based on a shifted measurement, that has six sensing spots or at least the four middle spots of a total of eight spots well within the edge contour.

According to a further embodiment, the shifted measurement may be performed in such a way, that only a subset of the sensing spots of the level sensor are used. The inner spots (inner four of the eight sensing spots) of the level sensor 2, 15 may be positioned as close to the edge contour as possible. This implies that two of the eight sensing spots cannot be used. However, since the inner spots usually provide more reliable data, in some cases this might lead to a more accurate tilt determination.

In the embodiments described above, measurement scans are used to measure tilt. The invention is however not limited to this. Also for controlling the height such a measurement scheme can be used to reduce the extrapolation distance to field where the height cannot be measured on the field itself.

While specific embodiments of the invention have been described above, it will be appreciated that the invention may be practiced otherwise than as described. Embodiments of the invention also include computer programs containing one or more sets (e.g. sequences) of machine-executable instructions describing one or more methods as disclosed herein, and data storage media (e.g. semiconductor memory such as ROM or RAM, magnetic or optical disk) having such sets of instructions stored therein. The description is not intended to limit the invention.

What is claimed is:

1. An assembly for determining at least one of tilt or height of a surface of a substrate in a lithographic apparatus, the assembly comprising:
   a substrate table configured to move said substrate along at least one path that is substantially parallel to a direction of a local tangent on an edge contour of said substrate;
   a sensor configured to measure said at least one of tilt or height along said at least one path; and
   a memory configured to store measurement data of said sensor for use during a later exposure of said substrate by said lithographic apparatus,
   wherein said at least one path of the substrate forms an angle with respect to an exposure scanning direction of said lithographic apparatus.

2. An assembly according to claim 1, wherein said sensor is configured to measure said at least one of tilt or height in a direction that is substantially along at least part of the edge contour of the substrate.

3. An assembly according to claim 2, wherein said sensor is configured to measure said tilt and height along the edge contour of the substrate during a same operation.

4. An assembly according to claim 2, wherein said sensor is further configured to approximate a geometry of the edge contour during a measurement of said at least one of tilt or height.

5. An assembly according to claim 4, wherein the approximation of the geometry of the edge contour is done by measuring along at least one of a plurality of straight lines that together follow said edge contour, a step-by-step path along said edge contour, or a contour substantially equal in shape to said edge contour.

6. An assembly according to claim 1, wherein said sensor is further configured to measure said at least one of tilt or height along a plurality of subsequent paths having gaps between them in which no measurement is performed.

7. An assembly according to claim 1, wherein said sensor comprises at least one sensing spot configured to measure height, said sensor being switchable between an on and an off state, which switching is effected as a function of a position of said sensor.

8. An assembly according to claim 1, wherein said sensor includes a plurality of sensing spots and wherein said sensor is further configured to measure said at least one of tilt or height only with a subset of the plurality of sensing spots along at least part of said at least one path.

9. An assembly according to claim 1, wherein said substrate comprises a target portion near an edge contour of said substrate and wherein during later exposure of said target portion said stored measurement data from a plurality of paths are used.

10. A lithographic projection apparatus comprising:
    a radiation system configured to supply a beam of radiation;
    a support structure configured to support a patterning structure, said patterning structure configured to pattern said beam of radiation according to a desired pattern;
    a substrate table configured to support a substrate and to move said substrate along at least one path that is substantially parallel to a direction of a local tangent on an edge contour of said substrate;
    a projection system constructed and arranged to project the patterned beam of radiation onto a target portion of the substrate, and
    an assembly for determining at least one of tilt or height of the surface of the substrate in a lithographic projection apparatus, the assembly comprising:
    a sensor configured to measure said at least one of tilt or height along said at least one path; and
    a memory configured to store measurement data of said sensor for use during a later exposure of said substrate by said lithographic projection apparatus,
    wherein said at least one path of the substrate forms an angle with respect to an exposure scanning direction of said lithographic projection apparatus.

11. A lithographic projection apparatus according to claim 10, wherein said lithographic projection apparatus is configured to project said radiation beam on a focal plane, to read the measurement data from the memory and to use the measurement data to adjust the position of the substrate to bring a target portion that is located on the substrate upon irradiation by the radiation beam into the focal plane of said radiation beam.

12. A lithographic projection apparatus according to claim 10, wherein said sensor, during measurement of said at least one tilt or height, irradiates said substrate with at least one spot, a maximum distance between the at least one spot and an edge contour being in a range of about 0.5 mm to 4 mm.

13. A lithographic projection apparatus according to claim 12, wherein the maximum distance between the at least one spot and an edge contour of said substrate is in a range of about 1.5 mm to 2.5 mm.

14. A method for determining at least one of tilt or height of a surface of a substrate in a lithographic projection apparatus, the method comprising:

moving the substrate along at least one path that is substantially parallel to a direction of a local tangent on an edge contour of said substrate;

providing measurement data about said at least one of tilt or height along said at least one path; and storing said measurement data in a memory for use during a later exposure of said substrate by said lithographic projection apparatus, wherein said at least one path of said substrate forms an angle with respect to an exposure scanning direction of said lithographic projection apparatus.

15. A method according to claim 14, further comprising:

patterning a beam of radiation;

projecting the patterned beam of radiation onto a target portion of a layer of radiation-sensitive material provided on said substrate;

scanning said substrate in the exposure scanning direction, and using said measurement data during exposure of said substrate.

16. A method according to claim 15, further comprising reading said at least one of tilt or height data from said memory, wherein said projecting comprises projecting the patterned beam of radiation on a focal plane on said substrate, and wherein using said measurement data during said exposure of said substrate comprises adjusting a position of said substrate to bring said target portion optimally in the focal plane of said radiation beam.

17. A method according to claim 14, further comprising measuring said at least one of tilt or height substantially along at least part of an edge contour of said substrate.

18. A method according to claim 17, wherein the measuring comprises measuring at least along one of a plurality of straight lines that together follow said edge contour, a step-by-step path along said edge contour, or a contour substantially equal in shape to said edge contour.

19. A method according to claim 14, further comprising determining said at least one of tilt or height on at least one substrate of a batch of substrates and using said at least one of tilt and height of said at least one substrate to estimate tilt and height for the remaining substrates of said batch.

20. An assembly for determining at least one of tilt or height of a surface of a substrate in a lithographic apparatus, the assembly comprising:

a substrate table configured to move said substrate along at least one path that is substantially parallel to a direction of a local tangent on an edge contour of said substrate;

a sensor configured to measure said at least one of tilt or height along said at least one path, said sensor including a plurality of sensing spots; and a memory configured to store measurement data of said sensor for use during a later exposure of said substrate by said lithographic apparatus, wherein said sensor is configured to measure said at least one of tilt or height with a predetermined subset of the plurality of sensing spots when one or more sensing spots are directed on or outside an edge contour of said substrate, and wherein said at least one path of said substrate forms an angle with respect to an exposure scanning direction of said lithographic projection apparatus.

21. An assembly for determining at least one of tilt or height of a surface of a substrate in a lithographic apparatus, comprising:

a substrate table configured to move said substrate along at least two paths that are substantially parallel to a direction of a local tangent on an edge contour of said substrate; and a sensor configured to measure said at least one of tilt or height along each of said at least two paths, wherein the direction of each of said at least two paths of the substrate is substantially parallel to the direction of the local tangent to a portion of an edge contour of said substrate proximate to said path, and wherein said at least two paths are contiguous and form an angle with respect to each other.

22. An assembly according to claim 21, wherein the direction of at least one of said at least two paths forms an angle with respect to an exposure scanning direction of said lithographic projection apparatus.

23. An assembly according to claim 21, further comprising a memory configured to store measurement data of said sensor.

24. An assembly according to claim 21, wherein the sensor is further configured to measure tilt or height along said edge contour of said substrate during a same operation.

25. A lithographic apparatus comprising:

a table configured to move a substrate along a path that is substantially parallel to a direction of a local tangent on an edge contour of the substrate and forms an angle with respect to an exposure scanning direction of the lithographic apparatus; and a sensor configured to measure at least one of a height or a tilt of the substrate at each of at least three different positions of the substrate table along the path, wherein movement of the substrate table from each of the at least three positions to a subsequent position includes movement along both of a first axis substantially parallel to the exposure scanning direction and a second axis substantially parallel to the direction of the local tangent on the edge contour of the substrate and forming an angle with respect to the first axis.

26. The lithographic apparatus according to claim 25, further comprising a memory configured to store information based on said at least one of a height or a tilt at said each of at least three different positions.

27. The lithographic apparatus according to claim 25, wherein at least a part of said path is proximate to a part of an edge contour of the substrate, and wherein the path is parallel to a local tangent of the part of the edge contour.

28. The lithographic apparatus according to claim 25, wherein said sensor is configured to measure a plurality of heights of the substrate at each of the at least three positions.

29. The lithographic apparatus according to claim 25, wherein the sensor is configured to measure at least one of the height or the tilt of the surface of the substrate at each of the at least three different positions of the substrate table along the path while the substrate table moves in a line substantially parallel to the direction of the local tangent on the edge contour of the substrate and at an angle to the exposure scanning direction.

30. The lithographic apparatus according to claim 25, wherein the lithographic apparatus is configured to expose a radiation-sensitive portion of the substrate, based on said at least one of the height or the tilt at each of said at least three different positions.

* * * * *